United States Patent
Han et al.

(10) Patent No.: US 10,444,904 B2
(45) Date of Patent: Oct. 15, 2019

(54) INPUT SENSING UNIT AND DISPLAY DEVICE INCLUDING THE SAME

(71) Applicant: Samsung Display Co., Ltd., Yongin-si (KR)

(72) Inventors: Jeong Yun Han, Yongin-si (KR); Hoe Seok Na, Yongin-si (KR); Gwang Bum Ko, Yongin-si (KR); Jeong Hoon Bang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 108 days.

(21) Appl. No.: 15/846,118

(22) Filed: Dec. 18, 2017

(65) Prior Publication Data

US 2019/0018541 A1 Jan. 17, 2019

(30) Foreign Application Priority Data

Jul. 11, 2017 (KR) .................. 10-2017-0087678

(51) Int. Cl.
*G06F 3/041* (2006.01)
*G06F 3/044* (2006.01)
*H01L 27/32* (2006.01)

(52) U.S. Cl.
CPC ............ *G06F 3/0418* (2013.01); *G06F 3/044* (2013.01); *H01L 27/323* (2013.01); *H01L 27/3276* (2013.01); *G06F 2203/04112* (2013.01); *H01L 27/3262* (2013.01)

(58) Field of Classification Search
CPC ............. H01L 27/3262; H01L 27/3276; H01L 27/323; G06F 3/044; G06F 3/0418; G06F 2203/04112
See application file for complete search history.

(56) References Cited

U.S. PATENT DOCUMENTS

| 8,970,515 | B2 | 3/2015 | Moran et al. |
| 9,081,453 | B2 | 7/2015 | Bulea et al. |
| 9,733,761 | B2 | 8/2017 | Ku et al. |
| 2015/0170575 | A1* | 6/2015 | Kwak ................. G06F 3/047 345/174 |

(Continued)

FOREIGN PATENT DOCUMENTS

| KR | 10-2011-0127236 | 11/2011 |
| KR | 10-2016-0084941 | 7/2016 |

(Continued)

*Primary Examiner* — Muhammad N Edun
(74) *Attorney, Agent, or Firm* — H.C. Park & Associates, PLC

(57) ABSTRACT

An input sensing unit includes sensing electrodes. Each of the sensing electrodes includes: first electrodes arranged in a column extending in a first direction; a second electrode extending in the first direction; first sensing lines connected to the first electrodes, the first sensing lines extending in the first direction; and a second sensing line connected to the second electrode, the second sensing line extending in the first direction. The first sensing lines are connected to first pad portions. The second sensing line is connected to a second pad portion. The second pad portions or some of the first pad portions are disposed between a first pad portion among the first pad portions and the second pad portion, the first pad portion being connected to a first sensing line closest to the second sensing line among the first sensing lines.

20 Claims, 10 Drawing Sheets

(56) References Cited

U.S. PATENT DOCUMENTS

| | | | |
|---|---|---|---|
| 2016/0041647 A1* | 2/2016 | Bae | G06F 3/044 |
| | | | 345/174 |
| 2016/0209954 A1* | 7/2016 | Cho | G06F 3/044 |
| 2017/0220166 A1* | 8/2017 | Hsu | G06F 3/044 |
| 2017/0364194 A1 | 12/2017 | Jang et al. | |
| 2018/0373359 A1 | 12/2018 | Han et al. | |

FOREIGN PATENT DOCUMENTS

| | | |
|---|---|---|
| KR | 10-2017-0142243 | 12/2017 |
| KR | 10-2019-0000026 | 1/2019 |

* cited by examiner

INPUT SENSING UNIT AND DISPLAY DEVICE INCLUDING THE SAME

CROSS-REFERENCE TO RELATED APPLICATION

This application claims priority from and the benefit of Korean Patent Application No. 10-2017-0087678, filed Jul. 11, 2017, which is hereby incorporated by reference for all purposes as if fully set forth herein.

BACKGROUND

Field

The disclosure generally relates to an input sensing unit and a display device including the input sensing unit.

Discussion

Display devices may be developed including an information input function together with a video display function. The information input function of a display device may be generally performed as an input sensing unit (or structure) for receiving a touch interaction (e.g., actual touch input, hovering input, etc.) of a user. In general, the input sensing unit may include touch electrodes and sensing lines connected to the touch electrodes, thereby, recognizing a touch event generated in a sensing region as an input signal.

The input sensing unit may include a non-sensing region outside a sensing region, e.g., surrounding the sensing region, and in which the sensing lines are disposed. The input sensing unit may be provided with a plurality of sensing lines connecting a sensing electrode to a pad portion. Capacitances may be generated between the sensing electrode and the plurality of sensing lines, and the capacitances may change depending on positions of the sensing electrode and the sensing lines. Detection accuracy and/or touch sensitivity may be degraded by issues, such as noise caused, at least in part, by a difference between abnormal capacitances. A need, therefore, exists for improved input sensing units capable of efficient, cost-effective techniques to at least reduce issues affecting detection accuracy and/or touch sensitivity.

The above information disclosed in this section is only for understanding the background of the inventive concepts, and, therefore, may contain information that does not form prior art.

SUMMARY

Some exemplary embodiments are capable of providing an input sensing unit that can minimize (or at least reduce) a capacitance deviation.

Some exemplary embodiments are capable of providing a display device including an input sensing unit that can minimize (or at least reduce) a capacitance deviation.

Some exemplary embodiments are capable of providing an apparatus that can minimize (or at least reduce) a capacitance deviation associated with input interaction detection.

Additional aspects will be set forth in the detailed description which follows, and, in part, will be apparent from the disclosure, or may be learned by practice of the inventive concepts.

According to some exemplary embodiments, an input sensing unit includes sensing electrodes. Each of the sensing electrodes includes: first electrodes arranged in a column extending in a first direction; a second electrode extending in the first direction; first sensing lines connected to the first electrodes, the first sensing lines extending in the first direction; and a second sensing line connected to the second electrode, the second sensing line extending in the first direction. The first sensing lines are connected to first pad portions. The second sensing line is connected to a second pad portion. The second pad portions or some of the first pad portions are disposed between a first pad portion among the first pad portions and the second pad portion, the first pad portion being connected to a first sensing line closest to the second sensing line among the first sensing lines.

According to some exemplary embodiments, a display device includes a display panel and an input sensing unit disposed on a surface of the display panel. The input sensing unit includes sensing electrodes. Each of the sensing electrodes includes: first electrodes arranged in a column extending in a first direction; a second electrode extending in the first direction; first sensing lines connected to the first electrodes, the first sensing lines extending in the first direction; and a second sensing line connected to the second electrode, the second sensing line extending in the first direction. The first sensing lines are connected to first pad portions. The second sensing line is connected to a second pad portion. The second pad portions or some of the first pad portions are disposed between a first pad portion among the first pad portions and the second pad portion, the first pad portion being connected to a first sensing line closest to the second sensing line among the first sensing lines.

According to some exemplary embodiments, an apparatus includes a first area and a second area. The first area includes sensing electrodes spaced apart from one another in a first direction. Each sensing electrode among the sensing electrodes includes: first electrodes spaced apart from one another in the first direction; a second electrode extending in the first direction, the second electrode being spaced apart from the first electrodes in a second direction crossing the first direction; first sensing lines respectively connected to the first electrodes; and a second sensing line connected to the second electrode. The second area is outside the first area. The second area includes pads. A first pad among the pads is connected to a first sensing line among the first sensing lines of a first sensing electrode among the sensing electrodes. The first sensing line is, among the first sensing lines of the first sensing electrode, most adjacent to the second sensing line of a second sensing electrode among the sensing electrodes. A second pad among the pads is connected to the second sensing line of the second sensing electrode. Third pads among the pads are disposed between the first pad and the second pad.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
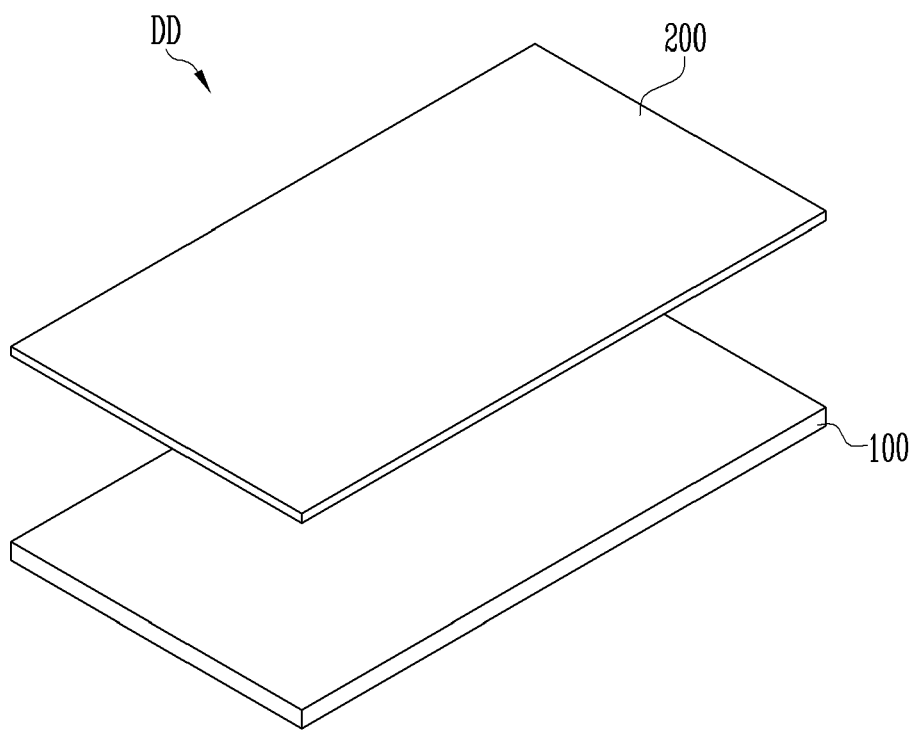
FIG. 1 is an exploded perspective view illustrating a display device including an input sensing unit according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be implemented in another exemplary embodiment without departing from the spirit and the scope of the disclosure.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as "elements"), of the various illustrations may be otherwise combined, separated, interchanged, and/or rearranged without departing from the spirit and the scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. To this end, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
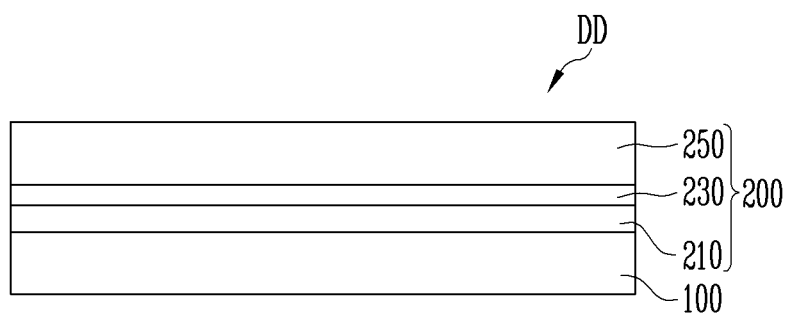
FIG. 2 is a schematic cross-sectional view of the display device illustrated in FIG. 1 according to some exemplary embodiments.
Figure 3:
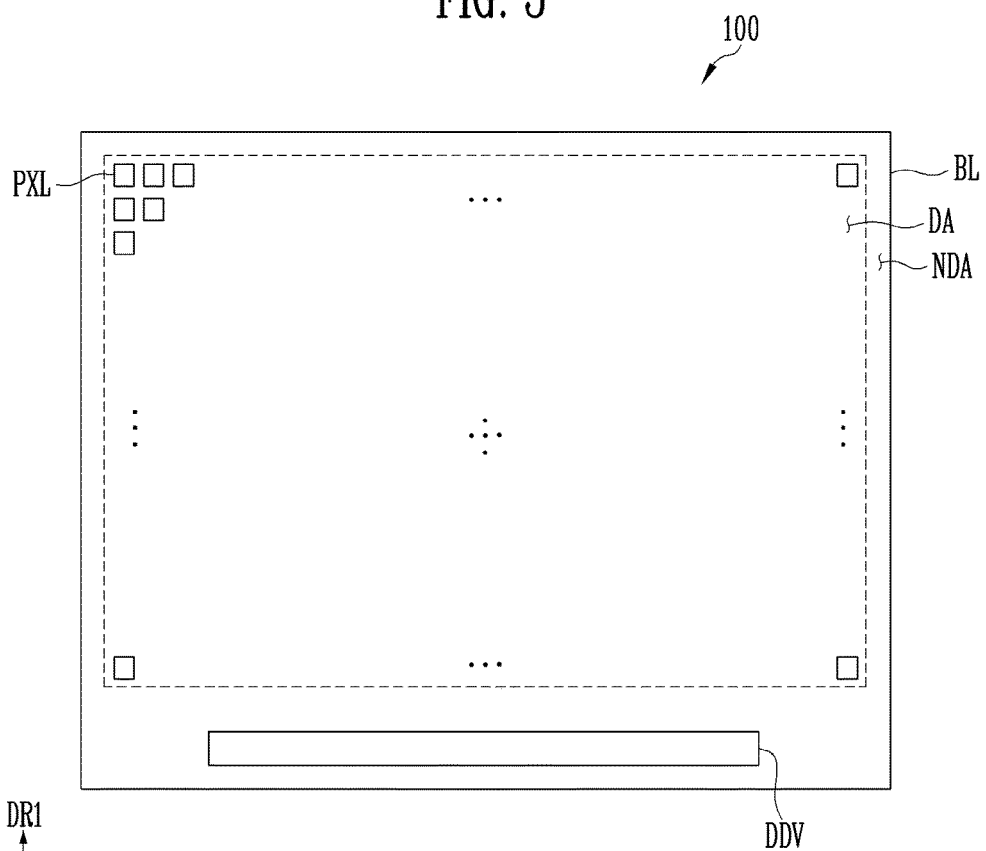
FIG. 3 is a plan view illustrating a display panel of the display device illustrated in FIG. 1 according to some exemplary embodiments.

FIG. 1 is an exploded perspective view illustrating a display device including an input sensing unit according to some exemplary embodiments. FIG. 2 is a schematic cross-sectional view of the display device illustrated in FIG. 1 according to some exemplary embodiments. FIG. 3 is a plan view illustrating a display panel of the display device illustrated in FIG. 1 according to some exemplary embodiments.

Referring to FIGS. 1 to 3, a display device DD may include a display panel 100 and an input sensing unit (or structure) 200.

The display panel 100 may display an image. The display panel 100 is not limited in particular. For example, a self-luminous display panel may be utilized as the display panel 100, such as an organic light emitting display panel, etc. As another example, a non-self-luminous display panel may be utilized as the display panel 100, such as a liquid crystal display panel, an electrophoretic display panel, an electrowetting display panel, or the like. In a case where the non-self-luminous display panel is used as the display panel 100, the display device DD may include a backlight unit for supplying light to the display panel 100. For convenience, an example in which the organic light emitting display panel is used as the display panel 100 will be described and illustrated.

The display panel 100 may be provided with a base layer BL including a display region DA and a non-display region NDA.

A plurality of pixels PXL may be provided in the display region DA of the base layer BL. Each pixel PXL may be any one of a red pixel, a green pixel, a blue pixel, and a white pixel, but embodiments are not limited thereto. For example, the pixel PXL may be a magenta pixel, a cyan pixel, a yellow pixel, etc.

The non-display region NDA of the base layer BL may be disposed outside the display region DA, e.g., the non-display region NDA may be disposed on at least one side of the display region DA, and may be disposed along the periphery of the display region DA. The non-display region NDA may be provided with a pad portion, described later, in which pads of wires are provided, and a data driver DDV, which proves data signals to the pixels PXL. The data driver DDV may provide the data signals to respective pixels PXL through data lines, described later. As seen in FIG. 3, the data driver DDV may be disposed on a horizontal portion of the non-display region NDA and may longitudinally extend in a first direction DR1 of the non-display region NDA; however, embodiments are not limited thereto.

Although a scan driver, a light emitting driver, and a timing controller are not illustrated in FIG. 3 for the sake of convenient description, the timing controller, the light emitting driver, and the scan driver may also be provided in the non-display region NDA, or may be connected to one or more portions of the non-display region NDA via, for instance, a flexible printed circuit board or other suitable structure.

The base layer BL may be formed of a flexible insulating material. The base layer BL may have substantially the same shape corresponding to a shape of the input sensing unit 200. The base layer BL may have the same area as the input sensing unit 200 or may have a larger area than the input sensing unit 200. Although described as a "layer" the base layer BL may be formed as a single layer structure, a multilayer structure, or a composite structure.

The base layer BL may include a plurality of signal lines (not illustrated) connected to the plurality of pixels PXL and a plurality of transistors (not illustrated) connected to the plurality of signal lines. The plurality of pixels PXL may be an organic light-emitting element including an organic layer, but embodiments are not limited thereto. For example, the plurality of pixels PXL may be realized in various forms, such as a liquid crystal element, an electrophoretic element, an electro-wetting element, etc. Each of the pixels PXL may be provided as a minimum unit for displaying an image. The pixel PXL may include an organic light emitting element which emits white light and/or color light.

As described above, each pixel PXL may include the plurality of signal lines, the plurality of transistors, and the organic light emitting element. A representative pixel PXL will be described later.

The input sensing unit 200 may be disposed on at least one of opposing surfaces of the display panel 100. For example, the input sensing unit 200 may be disposed on a surface of the display panel 100 in a direction in which an image is emitted so as to receive a touch input of a user. In some embodiments, the input sensing unit 200 may be formed integrally with the display panel 100. For convenience, a case where the input sensing unit 200 is provided on an upper surface of the display panel 100 will be described and illustrated as an example.

The input sensing unit 200 may include a touch sensor layer 210 disposed on one surface of the display panel 100 and an insulating layer 230 provided on the touch sensor layer 210.

The touch sensor layer 210 may recognize a touch event to the display device DD through a hand of a user or separate input means. In some embodiments, the touch sensor layer 210 may be driven in a mutual capacitance method. By using the mutual capacitance method, a change in capacitance due to an interaction between two touch sensing electrodes (described later) may be sensed. In some embodiments, use of a self-capacitance method enables a capacitance change of a touch sensing electrode in a touched region to be sensed using touch sensing electrodes arranged in a matrix shape and sensing lines connected to respective touch sensing electrodes, in a case where there is a touch interaction of a user.

The touch sensor layer 210 may include the touch electrodes, the sensing lines connected to the touch electrodes, and a pad portion connected to end portions of the sensing lines. The touch sensor layer 210 will be described later.

The insulating layer 230 may cover the touch sensor layer 210 and may protect the touch sensor layer 210 from the outside. According to some embodiments, the insulating layer 230 may include a material with elasticity, thereby being deformable depending on a touch pressure of a user. In this case, the touch sensor layer 210 may further include a pressure electrode that forms a capacitor together with the touch electrode.

The input sensing unit 200 may further include a window 250 provided on the insulating layer 230. The window 250 may be formed of a transparent material. The window 250 may protect an exposed surface of the input sensing unit 200. The window 250 makes an image from the display panel 100 pass therethrough and alleviates an external impact, thereby preventing the display panel 100 from being broken or malfunctioning due to the external impact. The external impact may mean a force causing a defect in the display panel 100 as an external force that can be expressed as pressure, stress, or the like. The window 250 may be flexible entirely or at least partially.

Figure 4:
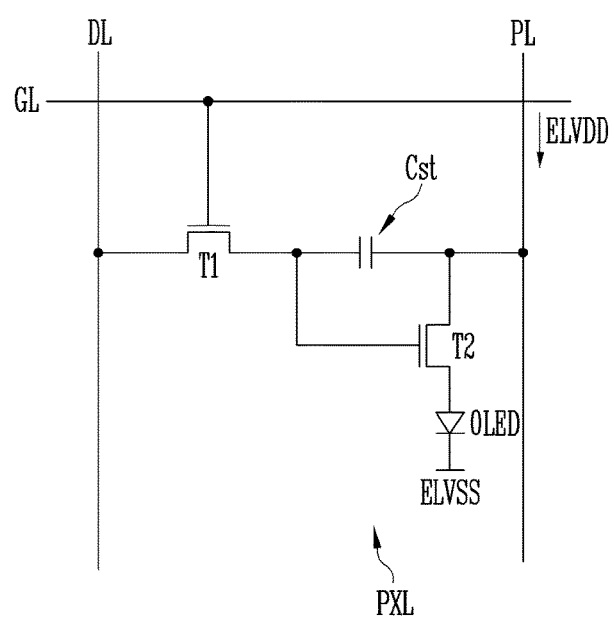
FIG. 4 is an equivalent circuit diagram illustrating a pixel among pixels of the display panel illustrated in FIG. 3 according to some exemplary embodiments.

FIG. 4 is an equivalent circuit diagram illustrating a pixel among pixels of the display panel illustrated in FIG. 3 according to some exemplary embodiments. The pixel and wires connected to the pixel are mainly illustrated in FIG. 4 as a representative pixel and wires, for the sake of convenient description and illustration.

Referring to FIGS. 3 and 4, each pixel PXL may include a transistor connected to the wires, a light emitting element OLED connected to the transistor, and a capacitor Cst. The light emitting element OLED may be a top emission type organic light emitting element or a backlight emitting type organic light emitting element. The organic light emitting element may be an organic light emitting diode.

Each pixel PXL may be a pixel driving circuit for driving the light emitting element OLED and may include a first transistor T1 (e.g., a switching transistor), a second transistor T2 (e.g., a driving transistor), and the capacitor Cst. A first power supply voltage ELVDD may be provided to the second transistor T2 and a second power supply voltage ELVSS may be provided to the light emitting element OLED. The second power supply voltage EVLSS may be set to a voltage lower than the first power supply voltage ELVDD.

The first transistor T1 outputs a data signal applied to the data line DL in response to a scan signal applied to a gate line GL. The capacitor Cst charges a voltage corresponding to the data signal received from the first transistor T1. The second transistor T2 is connected to the light emitting element OLED. The second transistor T2 controls a driving current flowing through the light emitting element OLED in correspondence with the amount of charge stored in the capacitor Cst.

In some embodiments, the pixel PXL includes two transistors T1 and T2, but embodiments are not limited thereto. For instance, the pixel PXL may include one transistor and one capacitor. As another example, the pixel PXL may include three or more transistors and two or more capacitors. For example, the pixel PXL may include seven transistors, the light emitting element OLED, and the capacitor CST.

Figure 5:
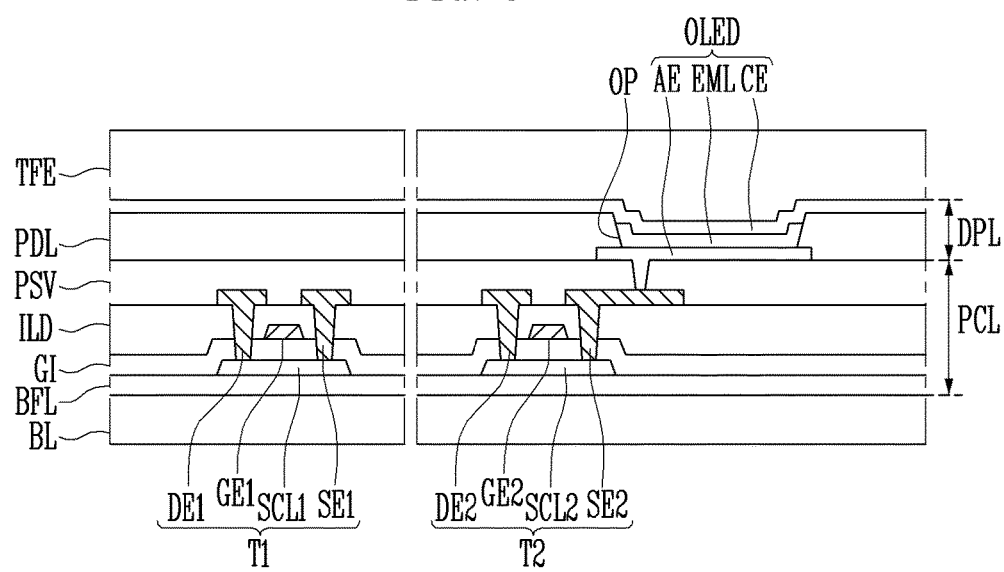
FIG. 5 is a cross-sectional view of a part of the display device illustrated in FIG. 1 according to some exemplary embodiments.

FIG. 5 is a cross-sectional view of a part of the display device illustrated in FIG. 1 according to some exemplary embodiments. The first and second transistors T1 and T2 provided in the pixel PXL and the light emitting element OLED connected to, for instance, the second transistor T2 are mainly illustrated in FIG. 5 for convenient description and illustration.

Referring to FIG. 5, the display device DD may include the base layer BL, a pixel circuit portion PCL, a display element layer DPL, and a thin film encapsulation film TFE.

The base layer BL may be formed of an insulating material, such as glass, resin, or the like. In addition, the base layer BL may be formed of a material with flexibility so as to be intentionally bent or folded, and may have a single-layer structure or a multi-layer structure.

For example, the base layer BL may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, a material configuring the base layer BL may be variously changed. For instance, the base layer BL may be formed of fiber glass reinforced plastic (FRP), or the like. A case in which the base layer BL is formed of a material with flexibility is described as an example.

The pixel circuit portion PCL may include a buffer layer BFL disposed on the base layer BL, and first and second transistors T1 and T2 disposed on the buffer layer BFL.

The buffer layer BFL may prevent impurities from diffusing into the first and second transistors T1 and T2. The buffer layer BFL may be provided as a single layer, but may also be provided as multiple layers of at least two or more layers. In a case where the buffer layer BFL is provided as multiple layers, each layer may be formed of the same material or may be formed of different materials. The buffer layer BFL may be omitted depending on a material of the base layer BL and process conditions, e.g., manufacturing process conditions.

The first transistor T1 may be a switching transistor for switching the second transistor T2. The second transistor T2 may be a driving transistor that is electrically connected to the light emitting element OLED of the display element layer DPL, and drives the light emitting element OLED.

The first transistor T1 may include a first semiconductor layer SCL1, a first gate electrode GE1, a first source electrode SE1, and a first drain electrode DE1. Although identified as first source electrode SE1 and first drain electrode DE1, these electrode identifiers may be swapped depending on, for example, a flow of current. The second transistor T2 may include a second semiconductor layer SCL2, a second gate electrode GE2, a second source electrode SE2, and a second drain electrode DE2. Similarly to the first source electrode SE1 and the first drain electrode DE1, although identified as second source electrode SE2 and second drain electrode DE2, these electrode identifiers may be swapped depending on, for example, a flow of current.

The first and second semiconductor layers SCL1 and SCL2 may be disposed on the buffer layer BFL. Each of the first and second semiconductor layers SCL1 and SCL2 includes a source region and a drain region that are in contact with one of the first and second source electrodes SE1 and SE2 and one of the first and second drain electrodes DE1 and DE2. A region between the source region and the drain region may be a channel region. The first and second semiconductor layers SCL1 and SCL2 may be a semiconductor pattern formed of polysilicon, amorphous silicon, oxide semiconductor, or the like. The channel region is a semiconductor pattern which is not doped with impurities, and may be an intrinsic semiconductor. The source region and the drain region may be a semiconductor pattern doped with impurities. The impurities may be formed using n-type impurities, p-type impurities, or other impurities, such as metals.

The first and second gate electrodes GE1 and GE2 may be provided on the first and second semiconductor layers SCL1 and SCL2 respectively with a gate insulating layer GI interposed therebetween. Here, the gate insulating layer GI may be an inorganic insulating film containing an inorganic material. For example, the gate insulating layer GI may be formed of silicon nitride, silicon oxide, silicon oxynitride, or the like.

The first source electrode SE1 and the first drain electrode DE1 may be connected to a source region and a drain region of the first semiconductor layer SCL1 respectively through contact holes passing through an interlayer insulating layer ILD and the gate insulating layer GI. The second source electrode SE2 and the second drain electrode DE2 may be connected a source region and a drain region of the second semiconductor layer SCL2 respectively through contact holes passing through the interlayer insulating layer ILD and the gate insulating layer GI. The interlayer insulating layer ILD may be an inorganic insulating film formed of an inorganic material or may be an organic insulating film formed of an organic material.

The pixel circuit portion PCL may further include a protection layer PSV disposed on the first and second transistors T1 and T2 to cover the first and second transistors T1 and T2.

The display element layer DPL may include a light emitting element OLED disposed on the protection layer PSV. The light emitting element OLED may include a lower electrode AE, an upper electrode CE, and a light emitting layer EML provided between the lower and upper electrodes AE and CE. Here, any one of the lower electrode AE and the upper electrode CE may be an anode electrode and the other may be a cathode electrode. For example, the lower electrode AE may be the anode electrode, and the upper electrode CE may be the cathode electrode. In some embodiments, the light emitting element OLED is a top emission type organic light emitting element, and, as such, the lower electrode AE may be a reflective electrode and the upper electrode CE may be a transmissive electrode. For convenience, a case where the light emitting element OLED is a top emission type organic light emitting element and the lower electrode AE is an anode electrode will be described and illustrated as an example.

The lower electrode AE may be connected to the second source electrode SE2 of the second transistor T2 through a contact hole passing through the protection layer PSV. The lower electrode AE may include a reflective layer (not illustrated) capable of reflecting light and a transparent conductive layer (not illustrated) disposed on an upper portion or a lower portion of the reflective layer. At least one of the transparent conductive layer and the reflective layer may be connected to the second source electrode SE2.

The display element layer DPL may further include a pixel defining film PDL including an opening OP exposing a part of the lower electrode AE, for example, an upper surface of the lower electrode AE. The pixel defining film PDL may include an organic insulating material. For example, the pixel defining film PDL may contain at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane-based resin, and silane-based resin.

The light emitting layer EML may be provided on the exposed surface of the lower electrode AE. The light emitting layer EML may include a low molecular material or a high molecular material. In some embodiments, the low molecular material may include at least one of copper phthalocyanine (CuPc), N, N-di(naphthalen-1-yl)-N, N'-diphenyl-benzidine (N, N'-Di(naphthalene-1-yl)-N, N'-diphenyl-benzidine: NPB), tris-8-hydroxyquinoline aluminum (Alq3), and the like. The high molecular material may include at least one of PEDOT, poly-phenylenevinylene (PPV) system, polyfluorene system, and the like.

The light emitting layer EML may be provided as a single layer, and may be provided as a multilayer including various functional layers. If the light emitting layer EML is provided as a multilayer, the multilayer may have a structure in which a hole injection layer, a hole transport layer, an emission layer, an electron transport layer, an electron injection layer, and the like are individually stacked or are compositely stacked. Of course, the light emitting layer EML is not limited to this structure, and may have various structures. In addition, at least a part of the light emitting layer EML may be integrally formed over a plurality of lower electrodes AE, and may be individually provided corresponding to each of the plurality of lower electrodes AE. The color of light generated in the light emitting layer EML may be any one of red, green, blue, and white, but embodiments are not limited thereto. For example, the color of light generated in a light generating layer of the light emitting layer EML may be any one of magenta, cyan, yellow, etc.

The upper electrode CE may be provided on the light emitting layer EML. The upper electrode CE may be a semi-transmissive reflective film. For example, the upper electrode CE may be a thin metal layer with a thickness capable of transmitting light emitted from the light emitting layer EML. The upper electrode CE may transmit a part of light emitted from the light emitting layer EML and reflect the remaining light emitted from the light emitting layer EML.

The thin film encapsulation film TFE may be provided on the light emitting element OLED. The thin film encapsulation film TFE may be configured by a single layer, and may be configured by multiple layers. The thin film encapsulation film TFE may include a plurality of insulating films covering the light emitting element OLED. For instance, the thin film encapsulation film TFE may include a plurality of inorganic films and a plurality of organic films. For example, the thin film encapsulation film TFE may have a structure in which the inorganic films and the organic films are alternately stacked. In some embodiments, the thin film encapsulation film TFE may be an encapsulation substrate that is disposed on the organic light emitting element and is adhered to the insulating substrate through a sealant.

Figure 6:
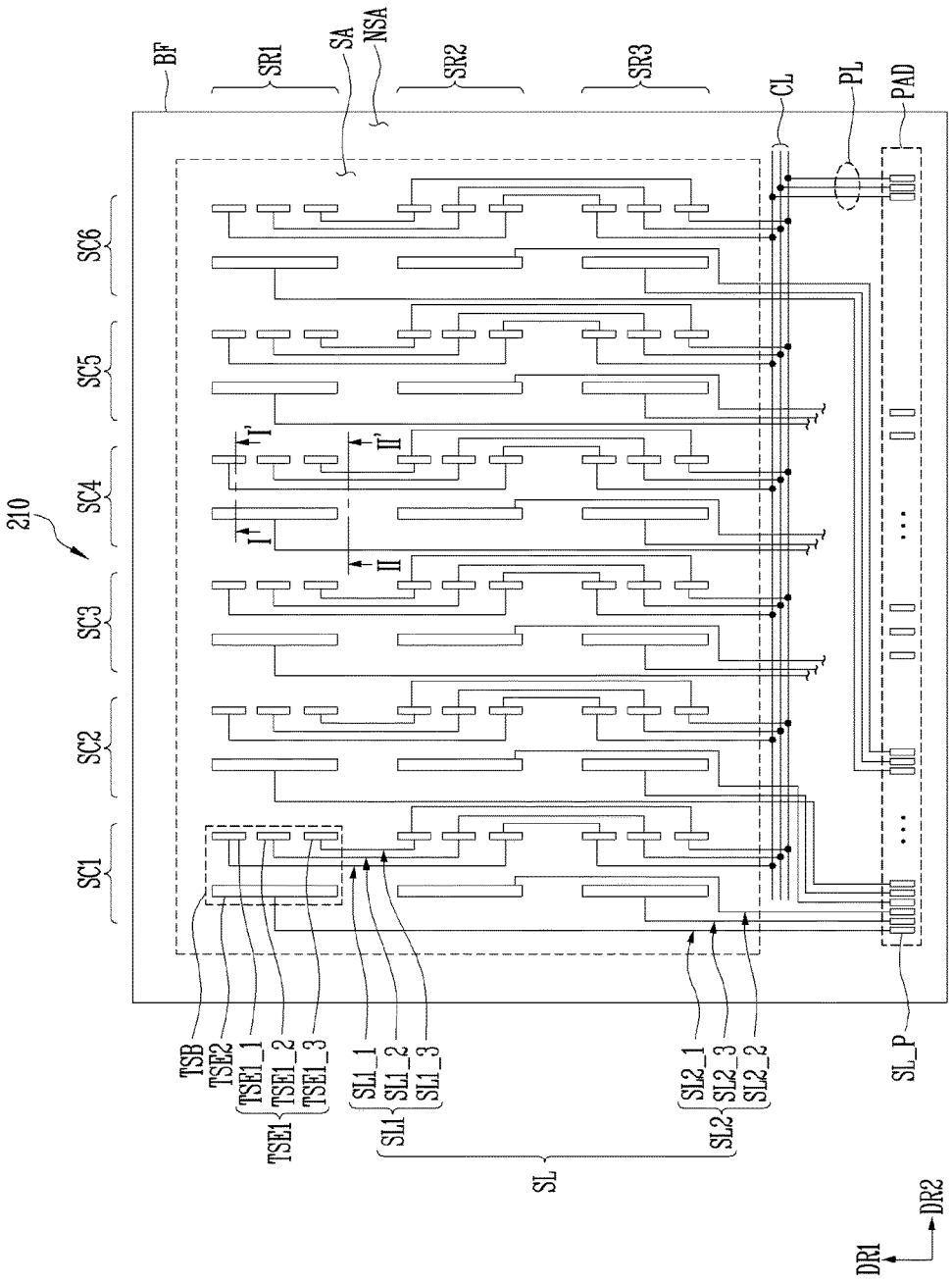
FIG. 6 is a plan view illustrating a touch sensor layer of the display device illustrated in FIG. 2 according to some exemplary embodiments.
Figure 7A:
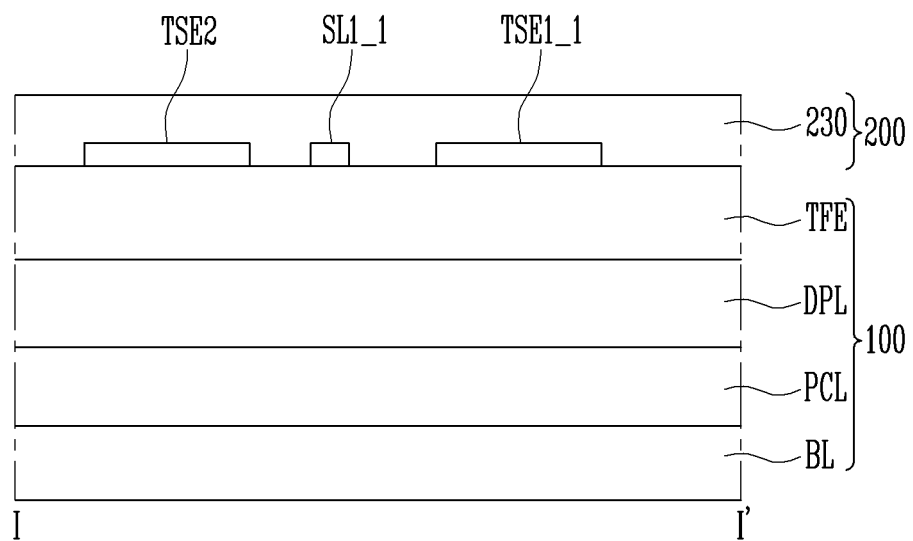
FIG. 7A is a cross-sectional view taken along sectional line I-I' of FIG. 6 according to some exemplary embodiments.
Figure 7B:
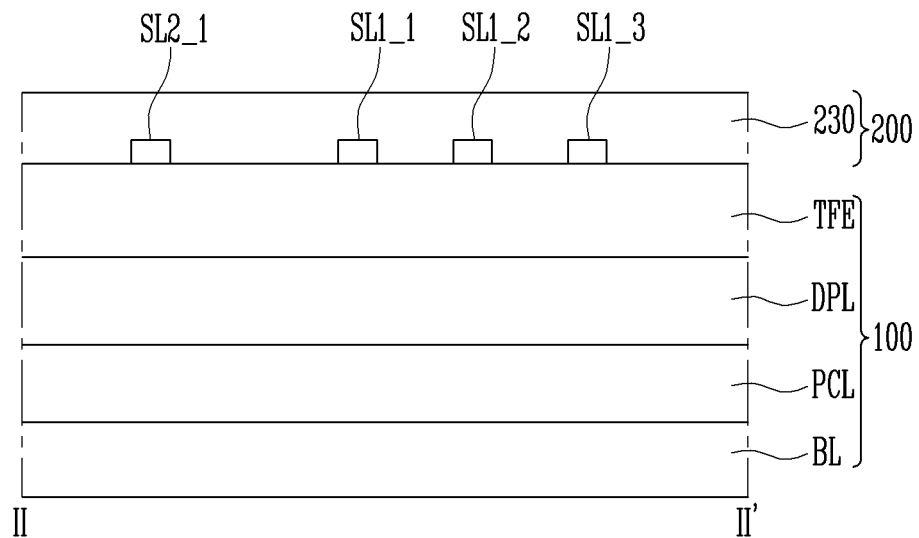
FIG. 7B is a cross-sectional view taken along sectional line II-II' of FIG. 6 according to some exemplary embodiments.
Figure 8A:
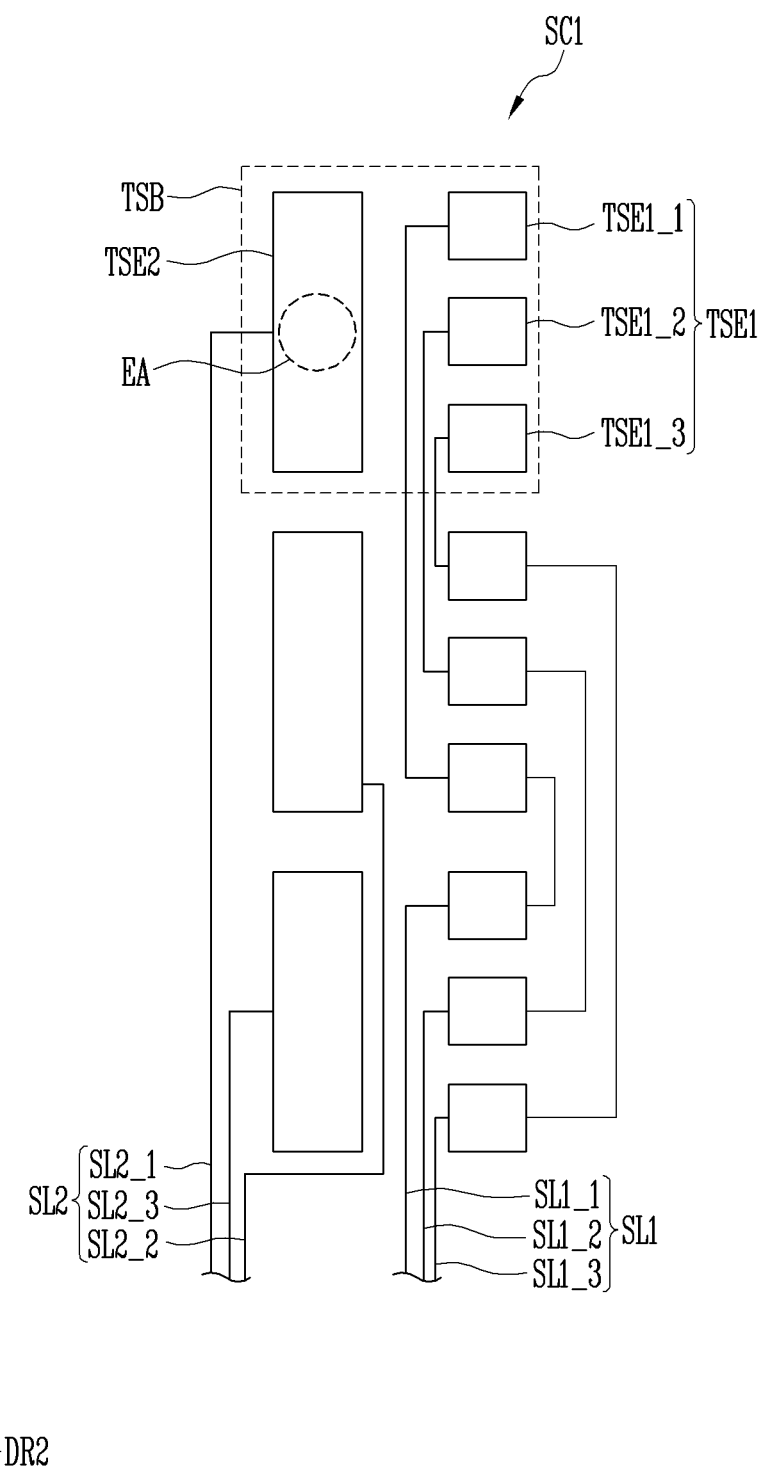
FIG. 8A is a plan view illustrating a first sensor column illustrated in FIG. 6 according to some exemplary embodiments.
Figure 8B:
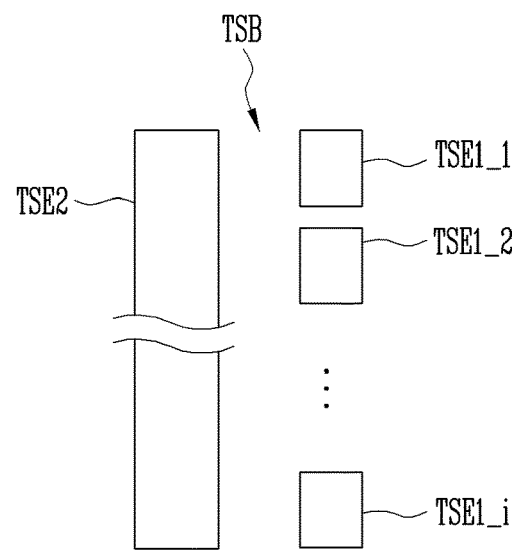
FIG. 8B is a plan view illustrating a sensing electrode illustrated in FIG. 8A according to some exemplary embodiments.

FIG. 6 is a plan view illustrating a touch sensor layer of the display device illustrated in FIG. 2 according to some exemplary embodiments. FIG. 7A is a cross-sectional view taken along sectional line I-I' of FIG. 6 according to some exemplary embodiments. FIG. 7B is a cross-sectional view taken along sectional line II-II' of FIG. 6 according to some exemplary embodiments. FIG. 8A is a plan view illustrating a first sensor column illustrated in FIG. 6 according to some exemplary embodiments. FIG. 8B is a plan view illustrating a sensing electrode illustrated in FIG. 8A according to some exemplary embodiments.

Referring to FIGS. 2, 6, 7A, 7B, 8A, 8B, and 8C the touch sensor layer 210 includes a base film BF including a sensing region SA and a non-sensing region NSA.

The base film BF may be formed of a flexible insulating material. The base film BF may be provided in substantially the same shape corresponding to a shape of the display panel 100. In some embodiments, the base film BF may be an inorganic film disposed as an outermost periphery (or layer) of the thin film encapsulation film TFE of the display panel 100.

The sensing region SA corresponds to a display region (refer to DA in FIG. 3) of the display panel 100, and may be provided in substantially the same shape as the display region DA. The non-sensing region NSA may be disposed to be adjacent to the sensing region SA, e.g., outside the sensing region SA. In addition, the non-sensing region NSA may correspond to a non-display region (refer to NDA in FIG. 3) of the display panel 100.

A plurality of sensing electrodes TSB may be disposed in the sensing region SA, and a plurality of sensing lines SL and a pad portion PAD may be disposed in the non-sensing region NSA.

The sensing electrodes TSB may define a plurality of sensor columns SC1 to SC6 and may define a plurality of sensor rows SR1 to SR3. Each of the plurality of sensor columns SC1 to SC6 may include a plurality of sensing electrodes TSB arranged in a first direction DR1 (column direction). The plurality of sensor columns SC1 to SC6 may be arranged in a second direction DR2 (row direction). FIG. 6 illustrates a plurality of sensing electrodes TSB arranged in a matrix form, but embodiments are not limited thereto.

A first electrode TSE1 including a plurality of electrodes TSE1_1, TSE1_2, and TSE1_3 may be provided in one sensing electrode TSB. Hereinafter, for convenience, the plurality of electrodes TSE1_1, TSE1_2, and TSE1_3 provided in one sensing electrode TSB is referred to as a "first sub-electrode." However, the "first sub-electrode" is merely a name introduced for the sake of convenient description, and a group of the first sub-electrodes is not the first electrode, each of the first sub-electrodes is regarded as the first electrode.

For example, three first sub-electrodes TSE1_1, TSE1_2 and TSE1_3 may be provided in one sensing electrode TSB. The (1-1)th to (1-3)th sub-electrodes TSE1_1, TSE1_2 and TSE1_3 may be sequentially arranged in the first direction DR1. That is, among the (1-1)th to (1-3)th sub-electrodes TSE1_1, TSE1_2 and TSE1_3, the (1-1)th sub-electrode TSE1_1 is disposed to be farthest from the pad portion PAD, the (1-3)th sub-electrode TSE1_3 may be disposed to be closest to the pad portion PAD.

The (1-1)th to (1-3)th sub-electrodes TSE1_1, TSE1_2 and TSE1_3 may be connected to the first sensing lines SL1. The first sensing lines SL1 may be disposed on the left side or the right side of the (1-1)th to (1-3)th sub-electrodes TSE1_1, TSE1_2, and TSE1_3. The (1-1)th to (1-3)th sub-electrodes TSE1_1, TSE1_2, and TSE1_3 may be connected to corresponding (1-1)th to (1-3)th sub-electrodes TSE1_1, TSE1_2, and TSE1_3 of an adjacent first electrode TSE1 in the first direction DR1 through the first sensing lines SL1.

If i first sub-electrodes TSE1_1, TSE1_2, and TSE1_3 are provided in one sensing electrode TSB, a (1-(j))th (j is a natural number less than or equal to i) sub-electrode of one first electrode TSE1 may be connected to a (1-(i−j+1))th sub-electrode of the adjacent first electrode TSE1 in the first direction DR1 through the jth first sensing line SL1. Accordingly, if the number of first sub-electrodes TSE1_1, TSE1_2, and TSE1_3 provided in the sensing electrode TSB is i, the number of first sensing lines SL1 corresponding to one of the sensor columns SC1 to SC6 may be i.

For example, if one sensing electrode TSB includes three first sub-electrodes TSE1_1, TSE1_2, and TSE1_3, the (1-1)th sub-electrode TSE1_1 may be connected to the (1-3)th sub-electrode TSE1_3 of the adjacent sensing electrode TSB through the (1-1)th sensing line SL1_1. In addition, the (1-2)th sub-electrode TSE1_2 of the sensing electrode TSB may be connected to the (1-2)th sub-electrode TSE1_2 of the adjacent sensing electrode TSB through the (1-2)th sensing line SL1_2. The (1-3)th sub-electrode TSE1_3 of the sensing electrode TSB may be connected to the (1-1)th sub-electrode TSE1_1 of the adjacent sensing electrode TSB through the (1-3)th sensing line SL1_3. Accordingly, the number of first sensing lines SL1 provided in one sensor column SC1 may be three.

The (1-1)th to (1-3)th sensing lines SL1_1, SL1_2 and SL1_3 may extend into the non-sensing region NSA in the first direction DR1 from the sensing region SA.

The first sensor column SC1 may include q (q is a natural number greater than or equal to 2) second electrodes TSE2. The second electrodes TSE2 may be arranged in the first direction DR1. The second electrodes TSE2 may be connected to the second sensing lines SL2. The number of second sensing lines SL2 corresponding to a second touch sensor column TSC2 may be equal to the number of second electrodes TSE2. For example, the number of second sensing lines SL2 corresponding to the first sensor column SC1 may be q. If three second electrodes TSE2 are arranged in the first sensor column SC1, the number of second sensing lines SL2 may be three. For instance, the second sensing lines SL2 may include a (2-1)th sensing line SL2_1 connected to the second electrode TSE2 disposed on an upper side of the first sensor column SC1, a (2-2)th sensing line SL2_2 connected to the second electrode TSE2 disposed in the center of the second touch sensor column TSC2, and a (2-3)th sensing line SL2_3 connected to the second electrode TSE2 disposed on a lower side of the second touch sensor column TSC2.

One of the first electrodes TSE1 and the second electrodes TSE2, for example, the first electrode TSE1, is a touch driving electrode for receiving a touch driving signal, and the other electrode, for example, the second electrode TSE2, may be a touch receiving electrode outputting a touch sensing signal. The touch sensor layer 210 may sense a touch interaction of a user through a capacitance change amount of a capacitor formed between the first electrodes TSE1 and the second electrodes TSE2.

The first electrodes TSE1 and the second electrodes TSE2 may sense a capacitance change from a touch input of an object, such as a user's body or a stylus pen. In addition, the first electrodes TSE1 and the second electrodes TSE2 may include conductive materials that can sense the capacitance change.

The first sensing lines SL1 and the second sensing lines SL2 may transmit the capacitance change sensed by the first electrodes TSE1 and the second electrodes TSE2 to an external circuit (not illustrated) through the pad portion PAD. In addition, the first sensing lines SL1 and the second sensing lines SL2 may include conductive materials in the same manner as the first electrodes TSE1 and the second electrodes TSE2.

The insulating layer 230 for covering the first and second sensing lines SL1 and SL2, the first electrodes TSE1, and the second electrodes TSE2 may be provided on the first and second sensing lines SL1 and SL2, the first electrodes TSE1, and the second electrodes TSE2.

Figure 8C:
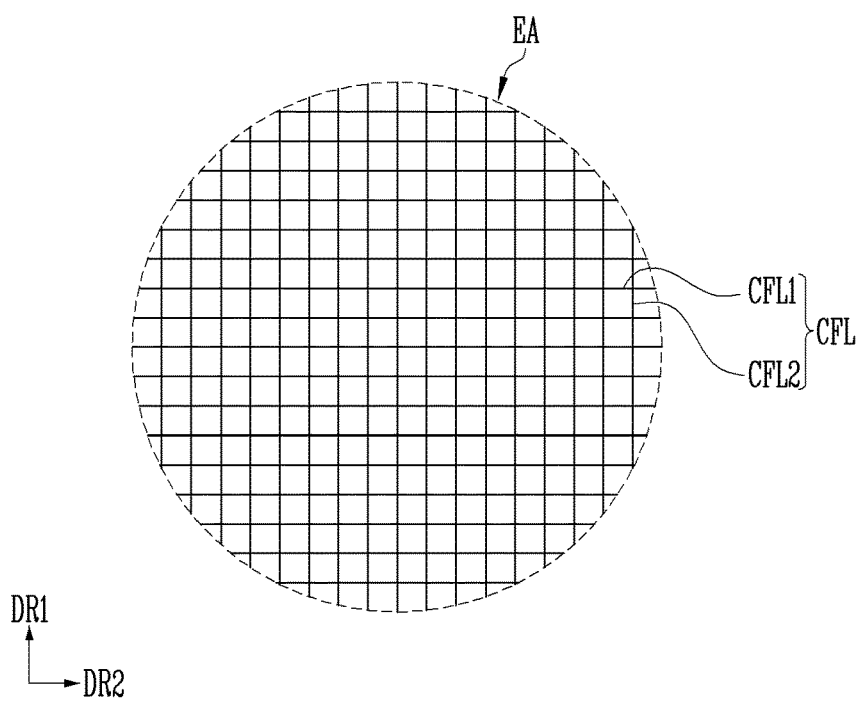
FIG. 8C is an enlarged view of an EA region of FIG. 8A according to some exemplary embodiments.

The second electrodes TSE2 may include a plurality of conductive fine lines CFL, as illustrated in FIG. 8C. For example, the second electrodes TSE2 may include a plurality of first conductive fine lines CFL1 extending in the second direction DR2 and parallel to each other, and a plurality of second conductive fine lines CFL2 extending in the first direction intersecting the second direction DR2 and parallel to each other. That is, each of the second electrodes TSE2 may have a mesh structure. The mesh structure may include a plurality of openings, for example, regions formed as the first conductive fine lines CFL1 intersect the second conductive fine lines CFL2.

Although the drawings illustrate each of the second electrodes TSE2 having a mesh structure, embodiments are not limited thereto. For example, each of the first sub-electrodes TSE1_1, TSE1_2, and TSE1_3 may additionally or alternatively include the plurality of conductive fine lines CFL.

If the first sub-electrodes TSE1_1, TSE1_2, and TSE1_3 and the second electrodes TSE2 have mesh structures, an area of the region where the first sub-electrodes TSE1_1, TSE1_2 and TSE1_3 and the second electrodes TSE2 overlap the display panel 100 may be reduced by the openings. If the area of the region where the first sub-electrodes TSE1_1, TSE1_2, TSE1_3 and the second electrodes TSE2 overlap the display panel 100 is reduced, an electromagnetic interference between the first sub-electrodes TSE1_1, TSE1_2, TSE1_3 and the second electrodes TSE2 and the display panel 100 may be prevented or reduced. Accordingly, touch sensing sensitivity of the touch sensor layer 210 may be improved.

The first conductive fine lines CFL1 and the second conductive fine lines CFL2 may contain at least one of aluminum (Al), copper (Cu), chromium (Cr), nickel (Ni), gold (Au), platinum (Pt), and an alloy thereof. In some embodiments, the first conductive fine lines CFL1 and the second conductive fine lines CFL2 may include a transparent conductive oxide. In addition, the first conductive fine lines CFL1 and the second conductive fine lines CFL2 may be provided as multiple layers including two or more conductive layers.

The first electrodes TSE1 and the second electrodes TSE2 may be provided on the display panel 100. For instance, the first electrodes TSE1 and the second electrodes TSE2 may be disposed on the thin film encapsulation film TFE of the display panel 100. The first electrodes TSE1 and the second electrodes TSE2 may be provided in the same layer. In some embodiments, the thin film encapsulation film TFE may be the base film BF. Accordingly, the first electrodes TSE1 and the second electrodes TSE2 may be provided in the same layer on the base film BF.

In addition, the first sensing lines SL1 and the second sensing lines SL2 may also be provided on the display panel 100. For instance, the first and second sensing lines SL1 and SL2 may be disposed on the thin film sealing film TFE. The first sensing lines SL1 may be provided in the same layer as the second sensing lines SL2. That is, the first and second sensing lines SL1 and SL2 may be provided in the same layer on the base film BF. The first and second sensing lines SL1 and SL2 may be provided in the same layer as the first electrodes TSE1 and the second electrodes TSE2.

The pad portion PAD may include a plurality of pads SL_P. The pads SL_P may be electrically connected to the first electrodes TSE1 and the second electrodes TSE2 through the first sensing lines SL1 and the second sensing lines SL2.

Connection lines CL electrically connected to the first sensing lines SL1 and/or the second sensing lines SL2 may be disposed in the non-sensing region NSA. A plurality of connection lines CL may be disposed in the non-sensing region NSA. In addition, the non-sensing region NSA may further include a pad line PL connecting the connection line CL to the pad portion PAD. A plurality of pad lines PL may also be provided.

The connection lines CL may be provided in the same number as the sum of the numbers of the first sensing line SL1 and the second sensing line SL2 disposed in the first sensor column SC1. The connection lines CL may be disposed on one side and the other side of the non-sensing region NSA, respectively, as illustrated in FIG. 6.

FIG. 6 illustrates that the connection lines CL are disposed on one side and the other side of the non-sensing region NSA, but embodiments are not limited thereto. According to some embodiments, the connection lines CL may also be provided as one line extending in the second direction DR2. In this case, the connection line CL may be provided as a multilayer in which at least two conductive layers are stacked. For example, the connection line CL may be provided as a multilayer structure including a first conductive layer, a second conductive layer disposed on the first conductive layer, and a third conductive layer disposed on the second conductive layer. Here, the first to third conductive layers may be insulated from each other by insulating layers (not illustrated).

Figure 9A:
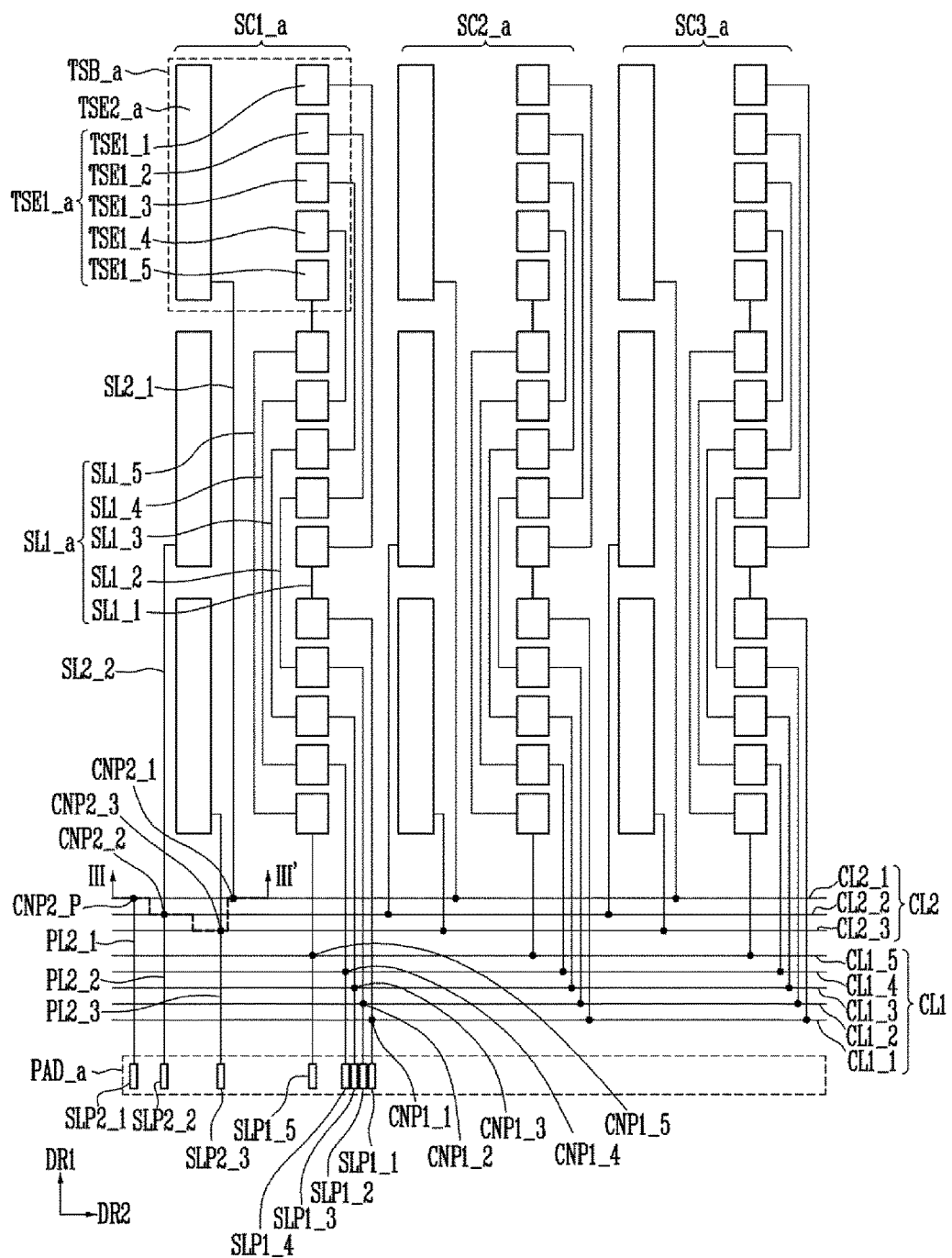
FIGS. 9A and 9C are plan views illustrating connection relationships between sensing electrodes according to various exemplary embodiments.
Figure 9B:
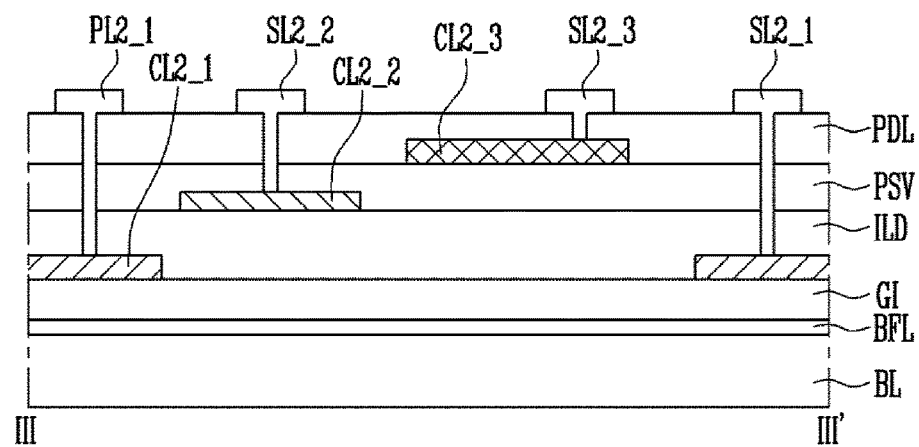
FIG. 9B is a cross-sectional view taken along sectional line III-III' of FIG. 9A according to some exemplary embodiments.
Figure 9C:
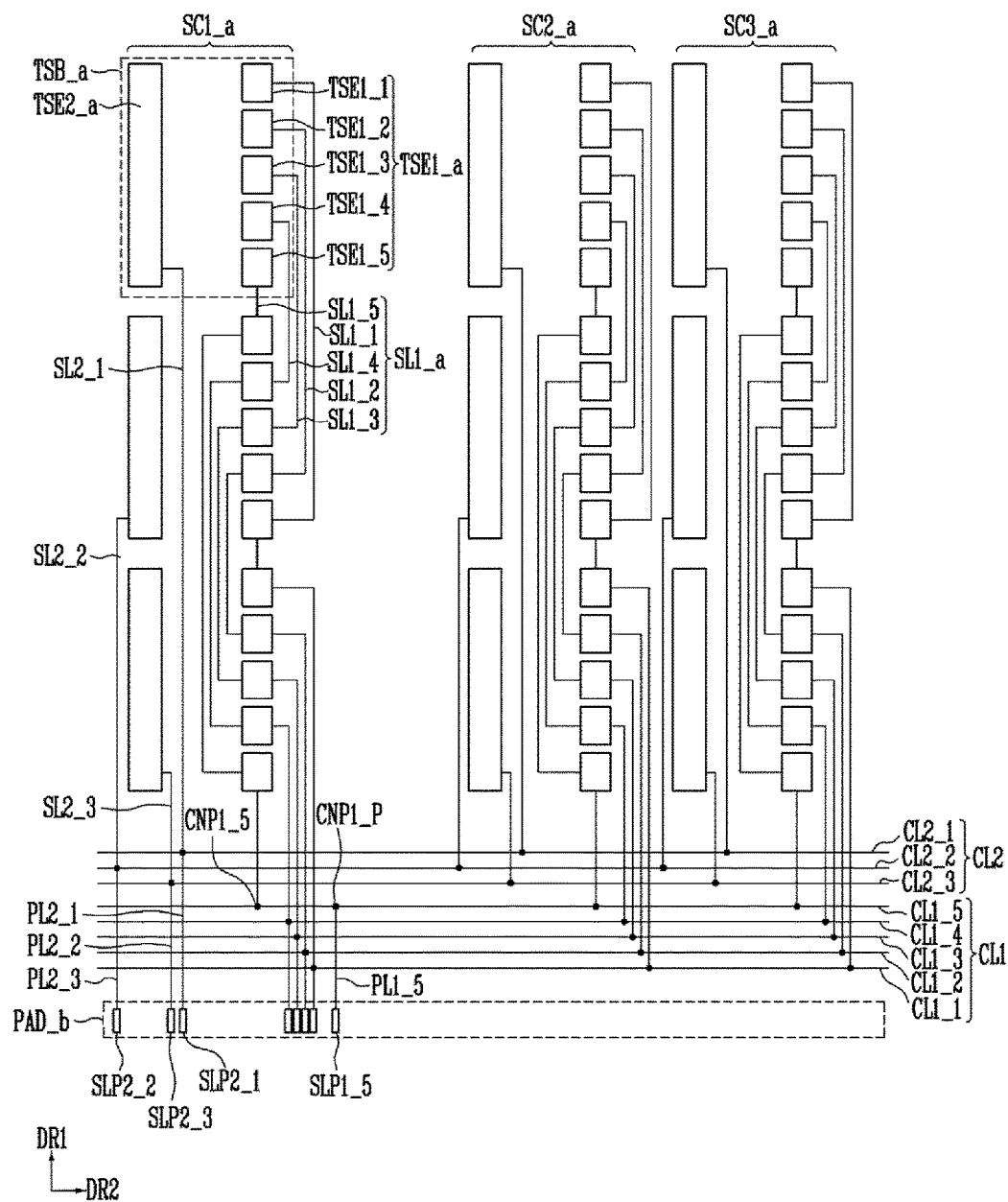

FIGS. 9A and 9C are plan views illustrating connection relationships between sensing electrodes according to various exemplary embodiments. FIG. 9B is a cross-sectional view taken along sectional line III-III' of FIG. 9A according to some exemplary embodiments. In FIGS. 9A to 9C, details of the sensing electrode TSB_a, the first electrode TSE1_a, the second electrode TSE2_a, and the first to third sensor columns SC1_a to SC3_a are similar to as previously described with respect to the sensing electrode TSB, the first electrode TSE1, the second electrode TSE2, and the first to third sensor columns SC1 to SC3. As such, primarily differences are described below.

Referring to FIG. 9A, for one sensing electrode TSB_a of the first sensor column SC1_a, a plurality of first sensing lines SL1_a, e.g., first sensing lines SL1_1 to SL1_5, extending in the first direction DR1 are connected to a plurality of first pad portions SLP1_1 to SLP1_5. The second sensing line SL2_1 extending in the first direction DR1 is connected to the second pad SLP2_1.

According to some embodiments, for one sensing electrode TSB_a, a plurality of second pad portions SLP2_2 and SLP2_3 and/or a plurality of first pad portions SLP1_2 to SLP1_5 are provided between a first pad portion SLP1_1 connected to the first sensing line SL1_1 adjacent to the second sensing line SL2_1 and the second pad portion SLP2_1.

For instance, as seen in FIG. 9A, the first sensing line closest to the second sensing line SL2_1 provided in the sensing electrode TSB located at the top in the first direction DR1 is the (1-1)th sensing line SL1_1. The plurality of second pad portions SLP2_2 and SLP2_3 is provided between the second pad portion SLP2_1 connected to the second sensing line SL2_1 and the first pad portion SLP1_5 connected to the (1-1)th sensing line SL1_1.

Since the second pad portion SLP2_1 and the (1-1)th pad portion SLP1_5 are separated from each other with another pad portion therebetween, a capacitance deviation can be reduced. Here, the capacitance variation may be a capacitance difference between capacitance of the first sensing line closest to the second sensing line SL2_1 and capacitance of the first sensing line farthest from the second sensing line SL2_1.

Since the second sensing line SL2_1 and the first sensing line SL1_1 are, relatively speaking, very close to each other, a relatively large capacitance may be generated between the two sensing lines. A magnitude of the capacitance is inversely proportional to a distance between the two conductors. Accordingly, capacitance smaller than the capacitance generated between the second sensing line SL2_1 and the (1-1)th sensing line SL1_1 is generated between the second sensing line SL2_1 and other first sensing lines SL1_2 to SL1_5. That is, when comparing capacitance of the (1-5)th sensing line SL1_5 farthest from the second sensing line SL2_2 with the capacitance of the (1-1)th sensing line SL1_1, a difference may be relatively large.

If the capacitance varies depending on wires as described above, an overflow may occur in a drive circuit connected to the pad portion PAD_a due to the capacitance difference. The overflow hinders normal operation of the input sensing unit, and, according to this, touch sensing capability of the input sensing unit may be reduced.

According to some embodiments, the second pad portion SLP2_1 and the (1-5)th pad portion SLP1_5 are separated from each other with another pad portion interposed therebetween, and, thus, a capacitance deviation can be reduced. The capacitance deviation can be reduced by disposing the second sensing line SL2_1 and the (1-1)th sensing line SL1_1, which are located relatively close to each other in a sensing line region, so as to be relatively far from one another in the pad portion PAD_a region.

The second pad portion SLP2_1 and the second sensing line SL2_1 may be connected to each other through the connection line CL2_1 so as to dispose the second sensing line SL2_1 and the (1-1)th sensing line SL1_1 relatively far from each other in the pad portion PAD_a region. That is, a pad line PL2_1 extending from the second pad portion SLP2_1 is connected to the connection line CL2_1 through a pad line connection point CNP2_P, and the connection line CL2_1 is connected to the connection line CL2_1 again through a second connection point CNP2_1. Accordingly, the second pad portion SLP2_1 and the (1-1)th pad portion SLP1_1 are located far from each other in the pad portion PAD_a region, and, thus, when viewed from the whole region of the input sensing unit, capacitance between the second sensing line SL2_1 and the (1-1)th sensing line SL1_1 may be relatively reduced. Furthermore, a difference between the capacitance between the second sensing line SL2_1 and the (1-5)th sensing line SL1_5 and capacitance between the second sensing line SL2_1 and the (1-1)th sensing line SL1_1 may be reduced when viewed from the whole region of the input sensing unit. Accordingly, the capacitance may be capacitance when viewed from the whole region of the input sensing unit.

A plurality of connection lines CL2_1, CL2_2, and CL2_3, a plurality of second sensing lines SL2_1, SL2_2, and SL2_3, and the pad line PL2_1 may be connected to each other in different layers, as illustrated in FIG. 9B.

Referring to FIG. 9B, the plurality of connection lines CL2_1, CL2_2, and CL2_3 are provided, and the plurality of connection lines CL2_1, CL2_2, and CL2_3 are provided in different layers. For example, the (2-1)th connection line CL2_1 may be provided on the gate insulating layer GI, the (2-2)th connection line CL2_2 may be provided on the interlayer insulating layer ILD, and the (2-3)th connection line CL2_3 may be provided on the protection layer PSV. However, the illustration of FIG. 9B is merely an example, and the number of connection lines or a position of each connection line may change as necessary.

The pad line PL2_1 and the plurality of second sensing lines SL2_1, SL2_2, and SL2_3 may be provided on the pixel defining film PDL and may be connected to the connection lines CL2_1, CL2_2, and CL2_3.

The connection point CNP2_P between the second pad portion SLP2_1 and the connection line CL2_1 and the connection point CNP2_1 between the connection line CNP2_1 and the second sensing line SL2_1 are separated from each other in the second direction DR2. This is for separating the second pad portion SLP2_1 from the (1-1)th pad portion SLP1_1 in the pad portion PAD_a region as described above.

When a plurality of sensor columns SC1_a, SC2_a, and SC3_a are provided, a plurality of sensing electrodes TSB_a may be provided in each of the sensor columns SC1_a, SC2_a, and SC3_a in the second direction DR2. However, the second sensing lines SL2_1 to SL2_3 included in each of the sensing electrodes TSB_a are not always configured to be far from the first sensing lines SL1_a in the pad region PAD_a as described above. That is, only in the sensing electrodes TSB_a at one end in the second direction DR2 among the plurality of sensing electrodes TSB_a provided in the second direction DR2, a plurality of second pad portions or a plurality of first pad portions may be provided between the first pad portion SLP1_5 connected to the first sensing line SL1_5 closest to the second sensing line SL2_1 and the second pad portion SLP2_1.

According to some embodiments, the first sensing line SL1_1 and the first pad portion SLP1_5 are connected to each other through the connection line CL1_5, and, thus, the plurality of second pad portions or the plurality of first pad portions may be provided between the first pad portion SLP1_5 connected to the first sensing line SL1_1 closest to the second sensing line SL2_1 and the second pad portion SLP2_1.

Referring to FIG. 9C, the (1-5)th sensing line SL1_5 is connected to the connection line CL1_5 through the (1-5)th connection point CNP1_5. In addition, the first pad line PL1_5 extending from the first pad portion SLP1_5 is connected to the connection line CL1_5 through the pad line connection point CNP1_P. Accordingly, the first pad portion SLP1_5 and the second pad portion SLP2_1 may be disposed to be relatively far from each other in the pad portion PAD_b, and when viewed from the whole input sensing unit, capacitance between the first sensing line SL1_5 and the second sensing line SL2_1 may be reduced. This may cause a capacitance deviation to be reduced as described above.

Table 1 below illustrates capacitance of the first sensing line SL1_5 closest to the second sensing line SL2_1 and capacitance of the first sensing line SL1_1 farthest from the second sensing line SL2_1, in the input sensing unit of an exemplary embodiment and a comparative example. The capacitances are calculated for an electrode region where the first electrodes TSE1_a and the second electrodes TSE2_a are provided, a wire region where the sensing lines SL1_a and SL2_1 to SL2_3 are provided, a connection region where the connection lines CL1 and CL2 are provided, and a pad region PAD_a or PAD_b, respectively.

TABLE 1

|  | Comparative Example 1 | | Exemplary Embodiment 1 | |
| --- | --- | --- | --- | --- |
|  | First sensing line closest to second sensing line | First sensing line farthest from second sensing line | First sensing line closest to second sensing line | First sensing line farthest from second sensing line |
| Electrode Region | 76 fF | 76 fF | 76 fF | 76 fF |

TABLE 1-continued

| | Comparative Example 1 | | Exemplary Embodiment 1 | |
|---|---|---|---|---|
| | First sensing line closest to second sensing line | First sensing line farthest from second sensing line | First sensing line closest to second sensing line | First sensing line farthest from second sensing line |
| Wire Region | 111 fF | 454 fF | 111 fF | 454 fF |
| Connection Region | 26 fF | 230 fF | 26 fF | 230 fF |
| Pad Region | 4 fF | 418 fF | 3 fF | 24 fF |
| Total Sum | 217 fF | 1178 fF | 216 fF | 784 fF |
| Deviation | 961 fF | | 568 fF | |

As can be seen from above Table 1, the capacitance deviation in some embodiments is 568 fF, which is a remarkably improved value compared with 961 fF in the comparative example. The reason why the capacitance deviation is reduced is due to a capacitance difference calculated in the pad region. In the comparative example, the capacitance of the first sensing line changes by approximately 414 fF depending on a position thereof with respect to the second sensing line. In contrast to this, in the exemplary embodiment 1, the capacitance of the first sensing line changes only by approximately 21 fF depending on a position thereof with respect to the second sensing line. Therefore, it is confirmed that the input sensing unit having a wiring structure according to various exemplary embodiments has a smaller capacitance deviation.

A display device according to some exemplary embodiments may be employed in various electronic apparatuses. For example, the display device may be applied to a television, a notebook computer, a mobile phone, a smart phone, a smart pad (PD), a personal media player (PMP), a personal digital assistance (PDA), a navigation device, various wearable devices, such as a smart watch, etc., and the like.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. An input sensing unit comprising:
sensing electrodes,
wherein each of the sensing electrodes comprises:
first electrodes arranged in a column extending in a first direction;
a second electrode extending in the first direction;
first sensing lines connected to the first electrodes, the first sensing lines extending in the first direction; and
a second sensing line connected to the second electrode, the second sensing line extending in the first direction,
wherein the first sensing lines are connected to first pad portions,
wherein the second sensing line is connected to a second pad portion, and
wherein second pad portions or some of the first pad portions are disposed between a first pad portion among the first pad portions and the second pad portion, the first pad portion being connected to a first sensing line closest to the second sensing line among the first sensing lines.

2. The input sensing unit according to claim 1, wherein each of the first pad portions other than the first pad portion is disposed between the first pad portion and the second pad portion.

3. The input sensing unit according to claim 1, wherein the sensing electrodes are arranged in at least one of the first direction and a second direction different from the first direction.

4. The input sensing unit according to claim 1, wherein:
the sensing electrodes are arranged in a column extending in the first direction; and
the first electrodes of a first sensing electrode among the sensing electrodes are connected to the first electrodes of another sensing electrode among the sensing electrodes through the first sensing lines.

5. The input sensing unit according to claim 4, wherein:
each of the sensing electrodes comprises i (i being a natural number greater than 1) first electrodes, and
wherein a jth (j being a natural number less than or equal to i) first electrode of the first sensing electrode is connected to a (i−j+1)th first electrode of the another sensing electrode, the another sensing electrode being adjacent to the first sensing electrode in the first direction.

6. The input sensing unit according to claim 1, further comprising:
a connection line extending in a second direction different from the first direction.

7. The input sensing unit according to claim 6, wherein:
the first sensing line is connected to the first pad portion through the connection line; and
the second sensing line is connected to the second pad portion through another connection line extending in the second direction.

8. The input sensing unit according to claim 6, wherein:
the connection line is one of a plurality of connection lines; and
at least some of the plurality of connection lines are provided in layers different from each other.

9. The input sensing unit according to claim 6, wherein a connection point between the second pad portion and the connection line is separated from a connection point between the connection line and the second sensing line in the second direction.

10. The input sensing unit according to claim 1, wherein each of the sensing electrodes comprises a first electrode among the first electrodes that is connected to a same first pad portion among the first pad portions.

11. The input sensing unit according to claim 1, wherein:
each of the first electrodes is a mesh-shaped conductor; and
the second electrode is a mesh-shaped conductor.

12. A display device comprising:
a display panel; and
an input sensing unit disposed on a surface of the display panel,
wherein the input sensing unit comprises sensing electrodes,
wherein each of the sensing electrodes comprises:
first electrodes arranged in a column extending in a first direction;
a second electrode extending in the first direction;
first sensing lines connected to the first electrodes, the first sensing lines extending in the first direction; and
a second sensing line connected to the second electrode, the second sensing line extending in the first direction, wherein the first sensing lines are connected to first pad portions, wherein the second sensing line is connected to a second pad portion, and wherein second pad portions or some of the first pad portions are disposed between a first pad portion among the first pad portions and the second pad portion, the first pad portion being connected to a first sensing line closest to the second sensing line among the first sensing lines.

13. The display device according to claim 12, wherein:
the display panel comprises:
   a base layer comprising a display region and a non-display region;
   a transistor on the base layer;
   a light emitting element electrically connected to the transistor; and
   a thin film encapsulation film covering the light emitting element; and
the thin film encapsulation film is a base film of a sensing region of the input sensing unit.

14. The display device according to claim 13, wherein:
the transistor comprises:
   a semiconductor layer on the base layer;
   a gate insulating layer on the semiconductor layer;
   a gate electrode on the gate insulating layer, the gate insulating layer being between the gate electrode and the semiconductor layer;
   an interlayer insulating layer on the gate electrode;
   a source electrode connected to the semiconductor layer through a first contact hole in the interlayer insulating layer; and
   a drain electrode connected to the semiconductor layer through a second contact hole in the interlayer insulating layer; and
the light emitting element is connected to the transistor via the source electrode or the drain electrode.

15. The display device according to claim 14, wherein:
the input sensing unit comprises connection lines extending in a second direction crossing the first direction;
the first sensing line is connected to the first pad portion through a first connection line among the connection lines; and
the second sensing line is connected to the second pad portion through a second connection line among the connection lines.

16. The display device according to claim 15, wherein at least some of the connection lines are provided in layers different from each other.

17. The display device according to claim 16, wherein a connection point between the second pad portion and the second connection line is separated from a connection point between the second connection line and the second sensing line in the second direction.

18. The display device according to claim 17, wherein the second connection line is disposed on the gate insulating layer.

19. An apparatus comprising:
   a first area comprising sensing electrodes spaced apart from one another in a first direction, each sensing electrode among the sensing electrodes comprising:
      first electrodes spaced apart from one another in the first direction;
      a second electrode extending in the first direction, the second electrode being spaced apart from the first electrodes in a second direction crossing the first direction;
      first sensing lines respectively connected to the first electrodes; and
      a second sensing line connected to the second electrode;
   a second area outside the first area, the second area comprising pads,
wherein:
   a first pad among the pads is connected to a first sensing line among the first sensing lines of a first sensing electrode among the sensing electrodes;
   the first sensing line is, among the first sensing lines of the first sensing electrode, most adjacent to the second sensing line of a second sensing electrode among the sensing electrodes;
   a second pad among the pads is connected to the second sensing line of the second sensing electrode; and
   third pads among the pads are disposed between the first pad and the second pad.

20. The apparatus of claim 19, wherein the third pads are connected to some of the first electrodes of the first sensing electrode other than the first electrode or are connected to second electrodes of some of the sensing electrodes other than the second sensing electrode.

* * * * *